United States Patent [19]

Asai et al.

[11] 4,313,251
[45] Feb. 2, 1982

[54] SYSTEM FOR APPLYING ELECTRONIC COMPONENTS TO A CIRCUIT BOARD

[75] Inventors: Koichi Asai, Nagoya; Tohsuke Kawada, Chiryu, both of Japan

[73] Assignee: Fuji Mfg. Co., Ltd., Aichi, Japan

[21] Appl. No.: 940,141

[22] Filed: Sep. 6, 1978

[30] Foreign Application Priority Data

Mar. 24, 1978 [JP] Japan .................................. 53-34659

[51] Int. Cl.³ ............................................ B23P 23/00
[52] U.S. Cl. .................................... 29/564.6; 29/714; 29/739
[58] Field of Search .............. 29/739, 740, 741, 564.6, 29/714

[56] References Cited

U.S. PATENT DOCUMENTS

| | | | |
|---|---|---|---|
| 3,597,824 | 8/1971 | Yoshida et al. | 29/741 X |
| 3,777,350 | 12/1973 | Maeda et al. | 29/739 X |
| 4,051,593 | 10/1977 | Mori et al. | 29/714 X |
| 4,196,513 | 4/1980 | Harigane et al. | 29/741 |

FOREIGN PATENT DOCUMENTS

51-12861 4/1976 Japan .

*Primary Examiner*—Nicholas P. Godici
*Assistant Examiner*—C. J. Arbes
*Attorney, Agent, or Firm*—Browdy and Neimark

[57] ABSTRACT

Method and a system for inserting electronic components. The system is composed of an electronic-component inserting machine for inserting electronic components to a printed circuit board and an electronic-component supplying machine, which comprises a plurality of cartridges, being two kinds according to the radial and axial type of the electronic components, for containing each kind of electronic components, detachably attached to a table. The method and system are characterized in being capable of supplying components free-selectively, of radial and axial type and of different lead wire gage, in a desired order, regardless of arbitrary supply arrangement of electronic components, with a single system. While the electronic components of desired type and gage are inserted, the then non-desired type and gage of electronic components are automatically suspended from being supplied in the same system.

11 Claims, 28 Drawing Figures

FIG.28

SYSTEM FOR APPLYING ELECTRONIC COMPONENTS TO A CIRCUIT BOARD

BACKGROUND OF THE INVENTION

This invention relates to a technology of applying or mounting electronic components, which are arranged on a tape, to a printed circuit board, more particularly, to an applying method and an apparatus suitably usable for the purpose of applying, in a desired sequence, electronic components, mixedly arranged of axial type and radial type, to a printed circuit board (hereinafter called simply p-c-b).

There are two kinds of electronic components (hereinafter called simply component when circumstances allow), one being of axial type in which a pair of lead wires are extended in a same axial but opposite direction from either end of the head of a component, and the other being of radial type in which a pair of lead wires are extended in a same parallel direction from the head of a component. Both type components, stuck on a tape in a large number and spaced an equal distance from each other, so-called electronic components in taping arrangement (hereinafter specifically referred to as taped components), are commercially available. Such taped components are suitably mounted onto a p-c-b by means of a component mounting machine. There is, however, a great problem in the mounting of those taped components, as easily imagined, due to the existence of the two type components. The prior arts are usually obliged to employ two kinds of mounting machines, according to the type of the components.

SUMMARY OF THE INVENTION

The axial type components are stuck to a pair of parallelly arranged tapes, just like a ladder, with the tips of their lead wires. The radial type components can be stuck, quite different from the previous ones, to a single tape with the tips of both lead wires.

Considering the actual practice, wherein even the axial type components are plastically deformed, prior to applying same to the p-c-b, into two parallelly extending lead wires with a predetermined inter-distance, the solving of the problem can be sought by installing a deforming mechanism to a cartridge containing those axial type components therein. This invention was made from such an idea to unite or combine the two types of mounting machines into one, commonly employable for both types, by means of disposing a particular device necessary for the deforming process to the cartridge.

It is therefore a primary object of this invention to provide a novel method and means of applying electronic components, which are different in type, radial and axial, to a printed circuit board, with a single component mounting system, in a desired order.

It is another object of this invention to provide a novel method and means of applying electronic components, which are different not only in type but also in lead wire gage or pitch, to a printed circuit board, with a single component mounting system, mixedly and in a desired order.

It is another object of this invention to provide a novel method and means of mounting electronic components, which are different not only in type but also in lead wire pitch, and at least one type of which are respectively different in lead wire pitch according to each containing apparatus of components, to a printed circuit board, with a single component-mounting system, mixedly and in a desired order.

It is still another object of this invention to provide a novel means and method of applying two types of components, axial and radial, to a p-c-b in a desired order or sequence, with a single component-mounting system, by means of (1) attaching a suitable number of cartridges for containing axial type taped components and another suitable number of cartridges for containing radial type taped components to one table in a desired arrangement; (2) relatively moving the component-mounting machine and the table; and (3) supplying the components regularly from a cartridge, which is confronted with the component-mounting machine, out of the plurality of cartridges.

It is a further important object of this invention to provide a novel component-mounting system, which is composed of a component mounting machine and a component supplying machine, which is capable of supplying components, different in type, in a desired order.

It is still a further object of this invention to provide a novel component mounting system, which is composed of a component mounting machine and a component supplying machine, which is capable of supplying components, different in type and lead wire pitch, in a desired order to the component mounting machine, for mounting the components to a printed circuit board.

It is still another object of this invention to provide a novel component mounting system, which is composed of a round table type component supplying machine with a plurality of different type cartridges containing taped components, and a component mounting machine, both being relatively movable in order to halt at a component transferring position.

It is a still further object of this invention to provide a novel component mounting system, which is composed of a movable component mounting machine along a straight line and a component supplying a machine of a straight table form.

It is still a further object of this invention to provide a novel component mounting system, which is composed of a component mounting machine and a component supplying machine capable of supplying components, different in type as well as in lead wire pitch, regularly in a desired order, in which supplying machine a plurality of cartridges are respectively provided with a device for blocking temporarily the operation of the supplier desired to be stationary.

DETAILED DESCRIPTION OF THE PREFERRED EMBODIMENTS

CONSTRUCTION

Figures 1, 2, 3, 4:
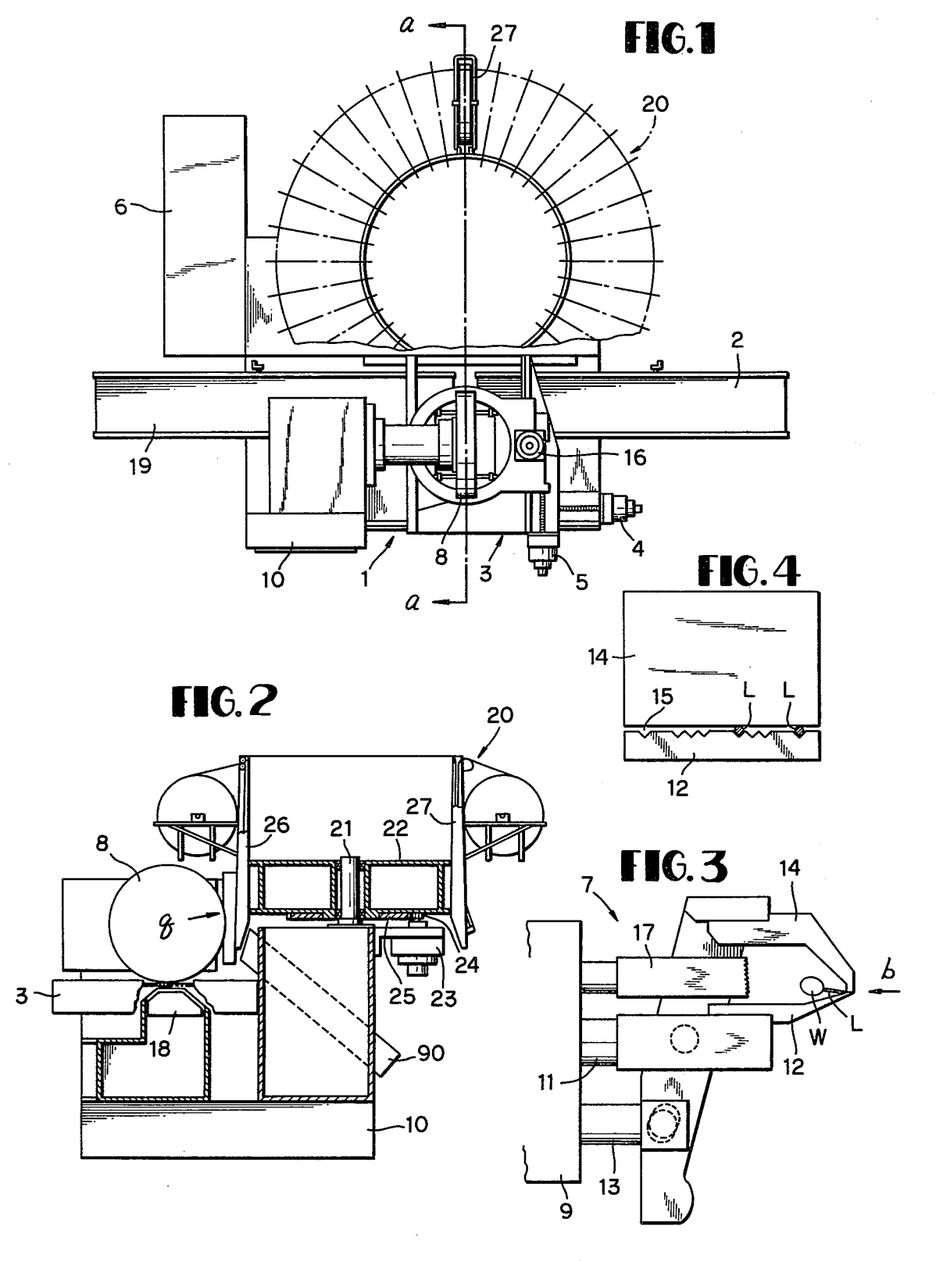
FIG. 1 is a general plan view of a component mounting system in accordance with this invention.
FIG. 2 is a cross-sectional view of FIG. 1 taken along the section line a-a.
FIG. 3 is an enlarged elevational view of a chuck incorporated in the system of FIG. 1.
FIG. 4 is an enlarged projection of a portion of FIG. 3 seen from b point.
Figure 28:
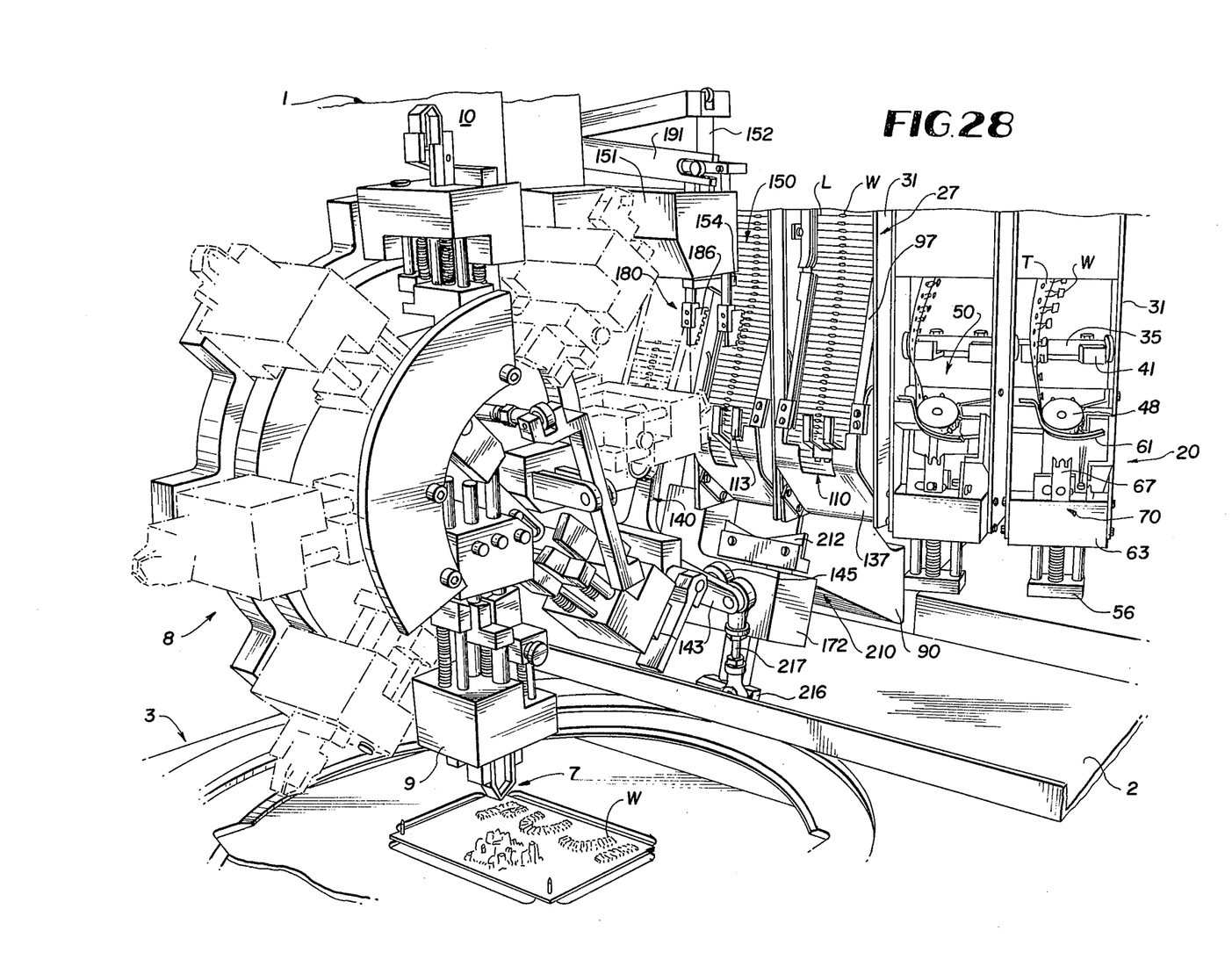
FIG. 28 is a perspective view of the component mounting system in accordance with this invention.

An electronic-component-mounting system is generally illustrated in FIGS. 1, 2 and 28, in plan and cross-section thereof, wherein a component-mounting machine is indicated with 1, and an in-conveyer 2 conveys a p-c-b, on which components are to be planted, so that the p-c-b may be attached to a p-c-b positioning mechanism 3 on the component-mounting machine 1, by means of a not-shown but well-known loader. The positioning mechanism 3 is provided with two servomotors 4 and 5, for movement in X axis and Y axis, and a servomotor 16 for rotation, these being under commanding signals from a control panel 6 for positioning the p-c-b in place.

The component-mounting machine 1 is further provided with a mounting mechanism 8 which comprises a turret table, intermittently rotated at a predetermined circumferential angle under the signal from the control panel 6, with a plurality of (eight in number in this embodiment) chucks 7, as shown in FIGS. 3 and 28, disposed radially with an equal circumferential angular distance. The chuck 7 is composed of a fixed (stationary) pawl 12, which is secured on the tip of a rod 11 slidably retained by a guide block 9, which is fixed near the outer periphery of the turret table, and a movable pawl 14 which is rotatably attached, in confrontation to the fixed pawl 12, for being rotated by the relative shifting between a rod 13 and the rod 11. A component W is, as shown in FIG. 4, held at its pair of leadwires L between the movable pawl 14 and V-shaped grooves 15 formed on the chucking surface of the fixed pawl 12, the grooves 15 being so spaced to provide a plurality of pairs of distances corresponding to various standardized inter-lead-wire pitches or gages; the component W thus held at its lead-wires L, after the chuck 7 has been positioned to a predetermined position on the p-c-b, is pushed out by a pusher head 17, and inserted into a pair of lead-wire-inserting holes formed in the p-c-b.

The lead-wires L projected to the rear side (back) of the p-c-b are bent (clinched) by a clinching mechanism 18, disposed below the inserting mechanism 8, along the back surface of the p-c-b. The component W is, in this way, firmly planted on the p-c-b.

A p-c-b which has been planted with a predetermined number of components W is removed from the p-c-b positioning mechanism 3, by an unloader (not shown), to be carried away by an out-conveyer 19 in FIG. 1.

Omitting a detailed description on the above-mentioned system, because of its detailed disclosure in U.S. copending application Ser. No. 936,578, filed Aug. 22, 1978, now U.S. Pat. No. 4,215,469, a component supplying machine 20, which is of great significance as the heart of the present invention, for enabling the mixed planting of both types of components, radial and axial, will be elaborated hereunder.

Main part of the component supplying machine 20, is rotatably sustained, as shown in FIG. 2, by a sustaining shaft 21, which is disposed on the upper surface, at a way back position, of the main body 10 of the component-mounting machine 1. It is provided with a rotation table 22 which is rotated by a rotating drive mechanism, being composed of a servomotor 23, a pinion 24, and a gear 25, in this embodiment. The rotation table 22 is rotated intermittently, under the command of the control panel 6, by a predetermined circumferential angle.

On the peripheral surface of the rotation table 22 are radially arranged cartridges 26 for radial type components and cartridges 27 for axial type components, 36 in number, spaced an equal circumferential distance apart.

Figures 5, 6, 7, 8, 9, 10, 11, 12, 13:
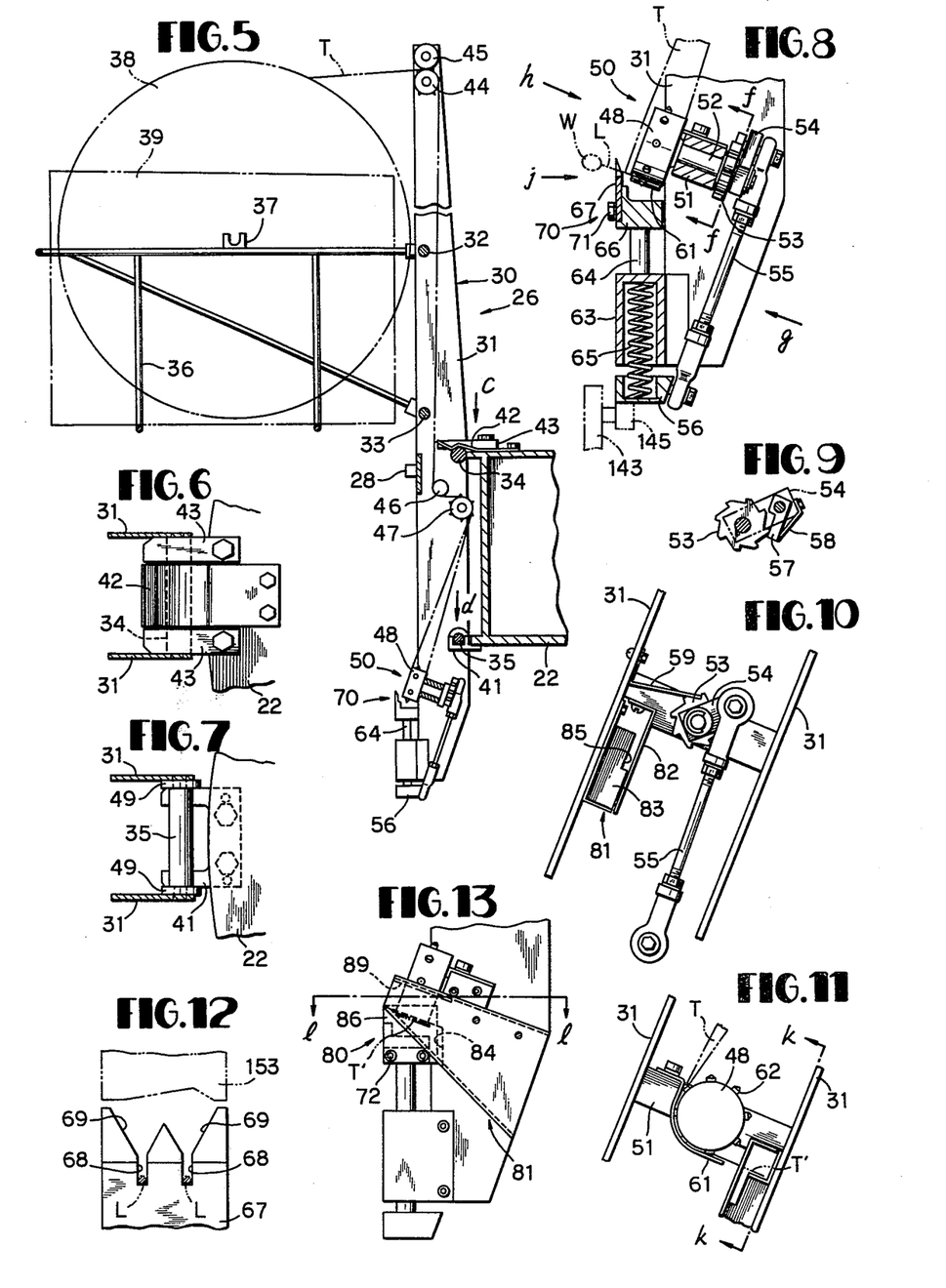
FIG. 5 is a vertical cross-section of a cartridge for containing radial type components shown with a part of a rotation table.
FIG. 6 is an enlarged projection of a portion of FIG. 5 seen from the c point.
FIG. 7 is an enlarged projection of a portion of FIG. 5 seen from the d point.
FIG. 8 is an enlarged projection of a portion of FIG. 5 seen from the e point.
FIG. 9 is a cross-section of FIG. 8 taken along the section line f-f.
FIG. 10 is a projection of FIG. 8 seen from the g point.
FIG. 11 is a projection of a part of FIG. 8 seen from the h point.
FIG. 12 is an enlarged projection of a guide blade of FIG. 8 seen from the j point.
FIG. 13 is a cross-section of FIG. 11 taken along the section line k-k.

The cartridge 26 for radial type components is, as shown in FIG. 5, provided with a frame work 30 made of two longitudinal side panels 31 united or connected by a plurality of lateral fastening members 32, 33, 34, and 35, which frame work of ladder form is detachably fixed to the rotation table 22 concurrently utilizing the fastening members 34 and 35. In other words, each of the frame works 30 of ladder form, thirty-six in all, is removably attached to the side (peripheral surface) of the rotation table 22 of drum shape, such that the lower portion of the frame work (of the cartridge) 30 is attached first with the fastening member 35 (refer to FIGS. 7 and 28) to a hook member 41 on the side of the rotation table 22, and then the fastening member 34 is snapped into place by being forcibly slipped under the holding spring 42 resisting the spring force thereof, by rotating the frame work 30 in a clockwise direction in FIG. 5. The fastening member 34 is slightly in abutment with the lower side of a stopper member 43 which is fixed on the upper side of the rotation table 22; so the cartridge 26 can not move upwards, deflecting the holding spring 42 upwardly, even when the cartridge 26 is imparted an upward force, such as when the component supplying operation is executed. A pair of stopper members 43 are fitted between the pair of side panels 31 of the cartridge 26, for functioning as positioning means in a circumferential direction for the cartridge 26 against the rotation table 22, in cooperation with a pair of hook members 41, which are fitted between two of the flanges 49 formed on either end of the fastening member 35 (see FIGS. 6 and 7).

The cartridge 26 is provided with a basket-body 36 for containing tape with loaded components, more particularly, for receiving a box 39 containing tape with loaded components folded, which basket body 36 is, by being fastened with bolts to the fastening members 32, 33, secured to the frame body 30. The basket body 36 is provided with, on the top thereof at the central portion, a sustaining fitting 37 to rotatably sustain, when necessary, the axis of a reel 38, on which a tape with loaded components is wound.

The cartridge 26 is further provided with a tape-drawing-out mechanism 50 for drawing (or pulling) out a tape with loaded components from the basket body 36, a lead-wire-positioning mechanism 70, for exactly positioning the lead wires L of a component held by the pulled out tape to the mounting mechanism 8, and a waste-tape-cutting mechanism 80 (FIG. 13) for shredering the cut-off tape, after the components have been removed, into small pieces. These mechanisms 50, 70, 80 are connected to a lifting member 56, disposed at the lower end of the cartridge 26, for being operated in interlock with the up-and-down motion of the lifting member 56. The lifting member 56 has a pair of parallel rods 64 erected (or stood) thereon, which are slidably fitted through a guide block 63 secured to the side panels 31, as shown in FIG. 8. The lifting member 56 is therefore slidable up and down; it is furthermore constantly biased downwardly by a compression spring 65 disposed between the lifting member 56 and the guide block 63. A roller 145 of a transmitting mechanism 140 positioned on the mounting machine side forcibly pushes up the lifting member 56; as the roller 145 descends, the lifting member 56 is moved downwards to the original position by the restoring force of the compression spring 65. Details of structure and operation of this transmitting mechanism will be described later.

The tape-drawing-out mechanism 50 includes, as shown in FIG. 5, a sprocket 44 and an adjacent roller 45 disposed in the vicinity of the top of the cartridge 26, both being freely rotatable. The sprocket 44 is provided with a plurality of engaging projections for engaging with a plurality of perforated feeding holes with a set pitch on the tape T for holding components W, while the roller 45 is provided with an annular groove at a position confronting those engaging projections, whereby a tape T can be pulled out of the reel 38 or the box 39 through the gap between the sprocket 44 and the roller 45. The tape T is further fed, via a guide roller 46 and a guide sprocket 47, to a feeding sprocket 48 to be wound thereabout after having been twisted 90 degrees.

A mechanism, in which the feeding sprocket 48 is intermittently rotated by a predetermined circumferential angle and consequently the tape T is pulled out with a predetermined pitch from the reel 38 or the box 39, is shown in FIGS. 8 to 11. The feeding sprocket 48 is secured on one end of a rotary shaft 52, which is rotatably sustained by a beam 51 spanned across the pair of side panels 31. On the other end of this rotary shaft 52 is secured a ratchet 53, and a pivoted lever 54. A connecting rod 55 links the lever 54 to the lifting member 56; a reciprocal, up and down, movement of the lifting member 56 consequently causes an oscillating movement of the lever 54 with a predetermined angle around the rotary shaft 52. On the free end of the lever 54 is pivoted a pawl 57, as shown in FIG. 9, which is constantly biased, by a leaf spring 58, onto the ratchet 53. This ratchet 53 is also provided with an anti-reversing leaf spring 59, as shown in FIG. 10, fixed on one of the side panels 31, for engaging the ratchet 53 with the leaf spring 59. When the connecting rod 55 is shifted upwards (in FIG. 10) and the lever 54 is anti-clockwise rotated, the ratchet 53 and the feeding sprocket 48 remain stationary, and only the pawl 57 is anti-clockwise rotated, resisting the spring force of the leaf spring 58, as shown in FIG. 9, to pass over a cog of the ratchet 53. When the connecting rod 55 is downwardly moved, the ratchet 53 is forcibly advanced, by one cog or tooth of the ratchet 53, accompanied by a movement of the feeding sprocket 48 in the identical direction by the same angle (refer to FIGS. 8 to 10). As can be seen in FIG. 11, the tape T is led along the feeding sprocket 48 for almost ¼ round, being guided by a guide plate 61, bent along the outer periphery of the feeding sprocket 48. The tape T is then, sandwiched between the feeding sprocket 48 and the guide plate 61, to pass therethrough, being engaged, at its feeding holes, with the engaging projections 62 of the feeding sprocket 48. A rotation of the feeding sprocket 48 by a predetermined angle corresponds with a feeding of the tape T by one pitch of the component arrangement thereon.

The lead-wire-positioning mechanism 70 is, as shown in FIG. 8, provided with a mounting member 66 secured to the top of the pair of rods 64, which are erected on the lifting member 56, and a guide blade 67 fixed on the mounting member 66 with a bolt 71. On the guide blade 67 are formed a pair of positioning grooves 68, which pair is of distance (gage) identical to one of the lead wire gages or pitches of the components, such as 1.5, 2.0, 2.5, 5.0, 6.0 mm, and guiding portions 69 for guiding the lead wires L to the positioning grooves 68. The guide blade 67 is raised, in conjunction with the ascending of the lifting member 56, to engage with, as shown in FIGS. 8 and 28, the middle portion of the lead wires L of the component W held by the tape T, which is sandwiched between the feeding sprocket 48 and the guide plate 61, for functioning as a lead-wire-positioner to exactly position the lead wires against one of the selected pairs of the V-grooves 15 formed on the chuck 7, and concurrently as a cutter for sheering the lead wires L, in cooperation with a later described cutting blade 153 disposed on the side of the mounting machine 1.

Figures 14, 15, 16, 20:
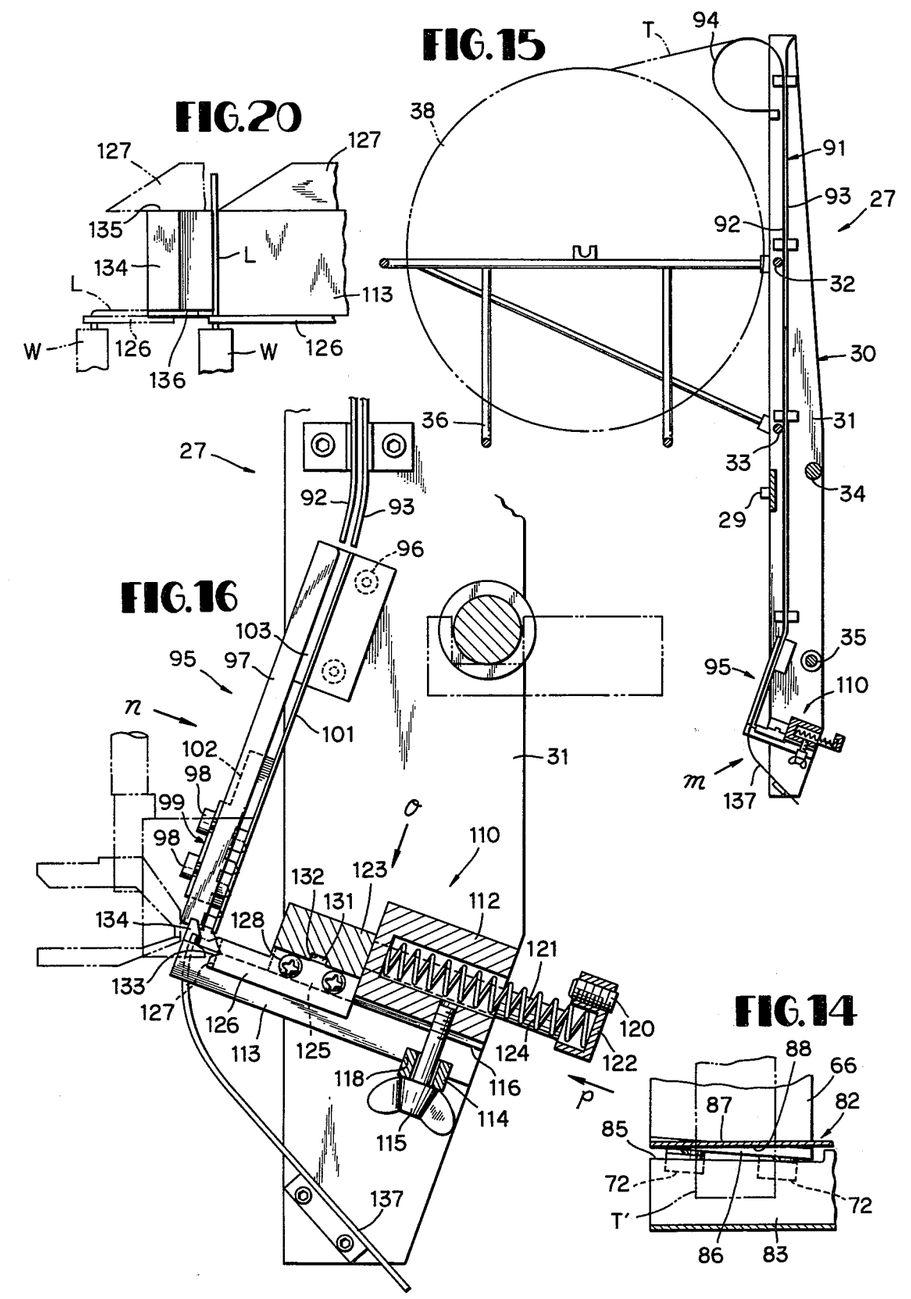
FIG. 14 is an enlarged cross-section of FIG. 13 taken along the section line l—l.
FIG. 15 is a vertical cross-section of a cartridge for containing axial type components used in the system shown in FIG. 1.
FIG. 16 is an enlargement of the m portion of FIG. 15.
FIG. 20 is an enlargement of an essential part of FIG. 18.

The waste-tape-cutting mechanism 80 is provided, as shown in FIGS. 10 and 13, with a chute 81 of square tube or tunnel shape divergent toward the outlet and a cutting blade 86. The chute 81 is composed of two chute members 82 and 83, made of plate members bent at right angles, the former 82, a first chute member, having a notch 84 of triangular shape (refer to FIG. 13), and the latter 83, a second chute member, having a notch 85 of elongated rectangular shape (refer to FIG. 10). The cutting blade 86 is secured with bolts 72 on a lateral side surface of the mounting member 66, on which the guide blade 67 is also secured. The cutting blade 86 is positioned, against the side wall of the first chute member 82, slightly slantwise, as shown in FIG. 14, that is to say, slightly crosswise with each other. When the cutting blade 86 is raised, it will naturally keep close contact with the side wall 87, while defecting outwardly (upward in FIG. 14) the same, because either end of the cutting blade 86 is positioned such that the right end portion (in FIG. 13) is inside of, and initially contacts with, the side wall 87 (lower side in FIG. 14), and left end portion is outside of, and later contacts with, the side wall 87. The cutting blade 86 is able to cut the waste tape T', by the shearing force generated between the same and the side wall 87, while proceeding into the notch 85 of the second chute member 83 with a slight forcible outward defection of the side wall 87. In other words, the side wall 87 of the first chute member 82 functions as a cooperator to the cutting blade 86 for cutting the waste tape T'. For allowing the outward deflection of the side wall 87, a slit-like notch 89 is formed on the upper portion of the side wall 87 as shown in FIG. 13. Shredded pieces of the waste tape T' are exhausted, via the chute 81 and a chute 90 in FIG. 2, to the rear of the main body 10 of the inserting machine 1.

The cartridge 26 is further provided with an engaging protrusion 28, as can be seen in FIG. 5, for engaging with the movable portion of a tape feeding mechanism 180 for axial type components to block the operation thereof, which operation will be explained later.

Now the cartridge 27 for axial type components will be described with reference to FIG. 15, wherein the same is provided with, similarly to the previous one for radial type components, the frame body 30 composed of a pair of side panels 31 fastened by a plurality of fastening members 32, 33, 34, and 35, removably attached to the rotation table 22 by advantageously utilizing the fastening members 34 and 35, and further provided with a basket body 36 for containing the taped components.

Figures 17, 18, 19:
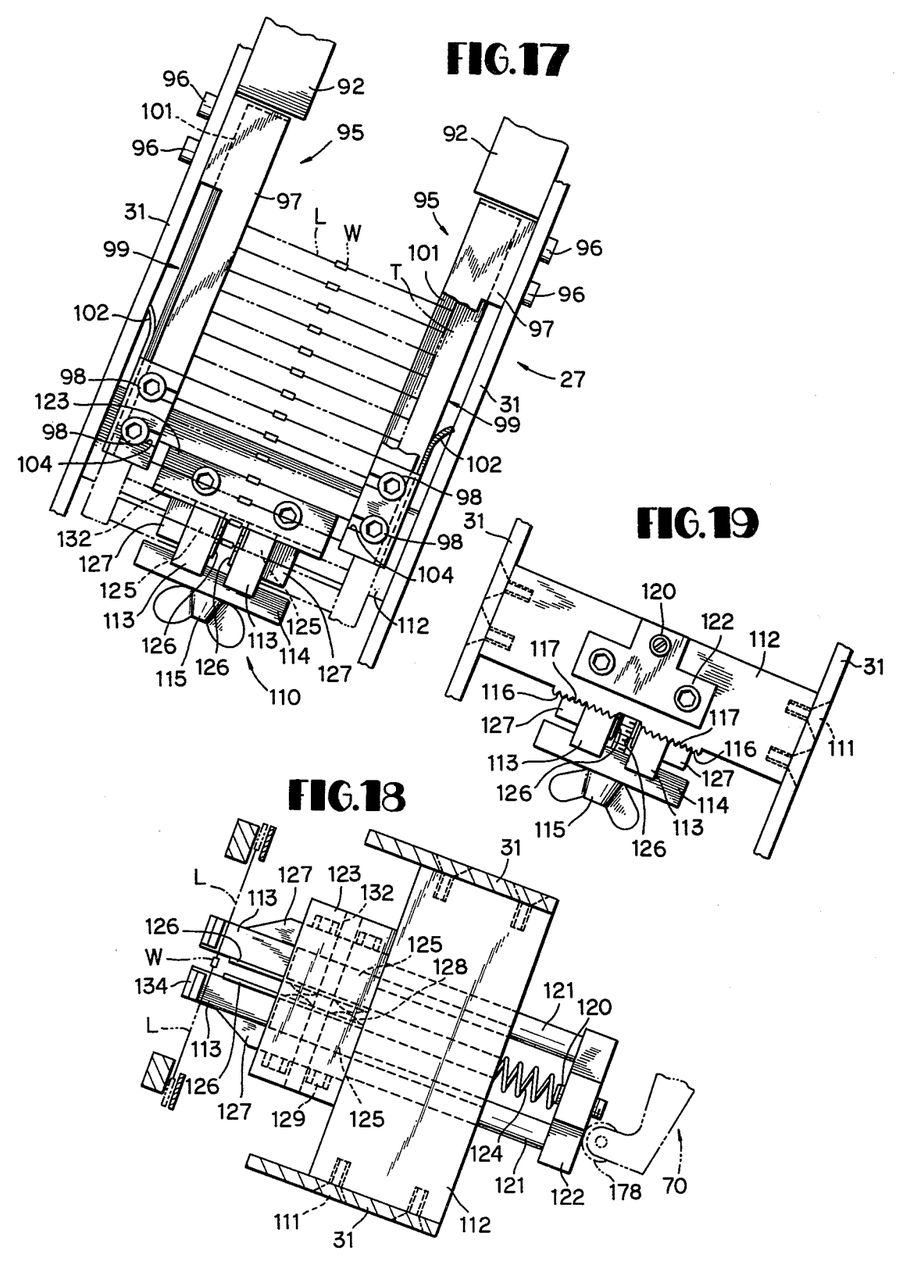
FIG. 17 is a projection of a portion of FIG. 16 seen from the n point.
FIG. 18 is a projection of a portion of FIG. 16 seen from the o point.
FIG. 19 is a projection of a portion of FIG. 16 seen from the p point.

The cartridge 27 is provided with, on either inside surface of the side panels 31, a guide rail 91 composed of a pair of strips 92 and 93, parallelly secured on the side panels 31 with a minute distance therebetween. The upper end of one strip 92 is bent almost circular for forming a guide portion 94 for a tape T. At the lower end of the guide rail 91 is disposed a tape guide 95, which is, as shown in enlargement in FIGS. 16 and 17, composed of brackets 97, secured with bolts 96 to the side panels 31 and guide members 99 secured with bolts 98 to the brackets 97. The guide member 99 has a rail portion 101 parallelly extending along the bracket 97 and a guide portion 102 outwardly curved. A tape T, which has been guided along a groove 103, formed between the rail portion 101 and the bracket 97, is to be guided by the guide portion 102 such that components W held by a tape T are situated substantially in the middle of the cartridge 27, in the lateral direction thereof. Holes 104 for attaching the guide member 99 to the bracket 97 are of elongated notch shape, as shown in FIG. 17, so that the distance between the guide portions 102 on either side may be adjusted.

The component drawing out mechanism for the axial type components is composed of the above detailed guide rail 91, the tape guide 95, and a tape feeding mechanism 180 (see FIG. 24), which is positioned on the inserting machine side for feeding a tape with loaded components pitch by pitch, description of which will be made later. The cartridge 27 is provided with a form-rectifying-and-positioning mechanism 110, which cuts the two lead wires L (refer to FIGS. 17, 18 and 28) of a taped component W to bend them by 90° to be exactly parallel with a predetermined distance therebetween, and precisely positions them against the chuck 7 of the mounting machine 1. Detailed construction and operation of the form-rectifying-and-positioning mechanism 110 will be elaborated hereunder, referring to the drawings 16 to 19. It is disposed on a base block 112, which is secured to the pair of side panels 31 with countersunk screws 111. On the lower side of the base block 112, a pair of guide arms 113 are secured parallelly to each other with fastening members 114 and a thumb-screw 115. On either contacting surface of the base block 112 and the guide arms 113 are formed serrations 116 and 117, which enable the distance between the two guide arms 113 to be progressively adjusted by every pitch of the serrations 116 and 117. The fastening member 114 is fitted into a rectangular recess 118 (see FIG. 16), formed on the lower side of the pair of guide arms 113, so that it may serve to keep the pair of guide arms 113 substantially parallel even when the thumb-screw 115 is loosened (or defastened). The base block 112 is slidably pierced by a pair of rods 121, on one end thereof is disposed a driven member 122, and on the other end thereof is secured a head block 123, the former being constantly biased by a compression spring 124 in the retracting direction. The driven member 122 is advanced, at a predetermined timing, by a roller 178 on the transmitting mechanism 170, which is positioned on the inserting machine side (refer to FIG. 18), as far as a stopper bolt 120 abuts on the base block 112, detailed description of the transmitting mechanism 170 being made later. Between the head block 123 and each of the guide arms 113 is fitted a sliding body 125 respectively. On the inner side of each sliding body 125 is disposed a supply guide 126, and on the outer side thereof is disposed a lead wire cutter 127 respectively with small screws 123 and nuts 129. The supply guide 126 and the lead wire cutter 127 sandwich not only the sliding body 125 but also the guide arm 113, as shown in FIG. 17; however, the supply guide 126 and the lead wire cutter 127 do not urge the guide arm 113 so heavily, because the sliding body 125 is slightly larger in width than the guide arm 113. On the upper surface of the sliding body 125 is formed a rectangular projection 131, which is engaged with a rectangular groove 132 formed on the lower surface of the head block 123. When the head block 123 is advanced, therefore, the sliding body 125, the supply guide 126, and the lead wire cutter 127 are integrally (as a united body) advanced along the guide arm 113. The supply guide 126 has a V-shaped notch 133 on the tip thereof, as shown in FIG. 16, for receiving the lead wire L in it, so as to position the same in relation to the perpendicular direction.

On the tip portion of the guide arm 113 is formed a projection 134 for not only cutting the lead wires L, in cooperation with the lead wire cutter 127, but also for rectifying the form of the lead wires L, with the help of the supply guide 126. This projection 134 is formed perpendicularly on the upper surface of the tip portion of the guide arm 113. One side 135 thereof adjacent to the lead wire cutter 127 is, as shown in FIG. 20, in alignment with the side surface of the guide arm 113, the other side 136 thereof adjacent to the supply guide 126 being recessed (or inwardly stepped) from the side surface of the guide arm 113 by a dimension substantially equal to the diameter of the lead wire L. So the lead wires L, which have been advanced resting in the V-shaped notch 133, will be first sheared, when the supply guide 126 and the lead wire cutter 127 are integrally advanced, between the lead wire cutter 127 and the side surface 135 of the projection 134, and then bent perpendicularly between the supply guide 126 and the side surface 136 of the projection 134, simultaneously being form-rectified straight-forwards. When the supply guide 126, after having pushed forward the component W as far as the position indicated with a two-dot-chain line in FIG. 20, is retracted the component W is to be held by the guide arm 113 at the tip of the lead wire L. As the lead wire L in this status is exactly positioned, in the horizontal direction, by the guide arm 113, it can be exactly grasped, at the middle portion thereof, by the predetermined pair of V-grooves (at the predetermined position) formed on the fixed pawl 12 of the chuck 7 as shown in FIG. 4 on the mounting machine 1, by means of approaching the chuck 7 in an opened status. In other words, the guide arm 113 can be said to concurrently function as a positioning member for the lead wires.

The cartridge 27 is further provided with, at a middle portion thereof as shown in FIG. 15, an engaging projection 29, which is to engage with a movable portion of the lead wire cutting mechanism 150 for radial type components in order to block the later described operation thereof.

At the lower end of the cartridge 27 is attached a waste tape guide 137 for guiding the waste tape, after the components having been removed, in such a manner as to be connected to the tape guide 95.

Either of the cartridge 26 for the radial type components and the cartridge 27 for the axial type components is, in principle, provided with, as above described, some built-in mechanisms for supplying components to the inserting machine 1. However, some others of such mechanisms for supplying components are placed or positioned on the mounting machine side, which will be illustrated, with reference to FIGS. 21 to 25, one by one in order, with distinction between the two types, radial and axial.

Figures 21, 22, 23, 26:
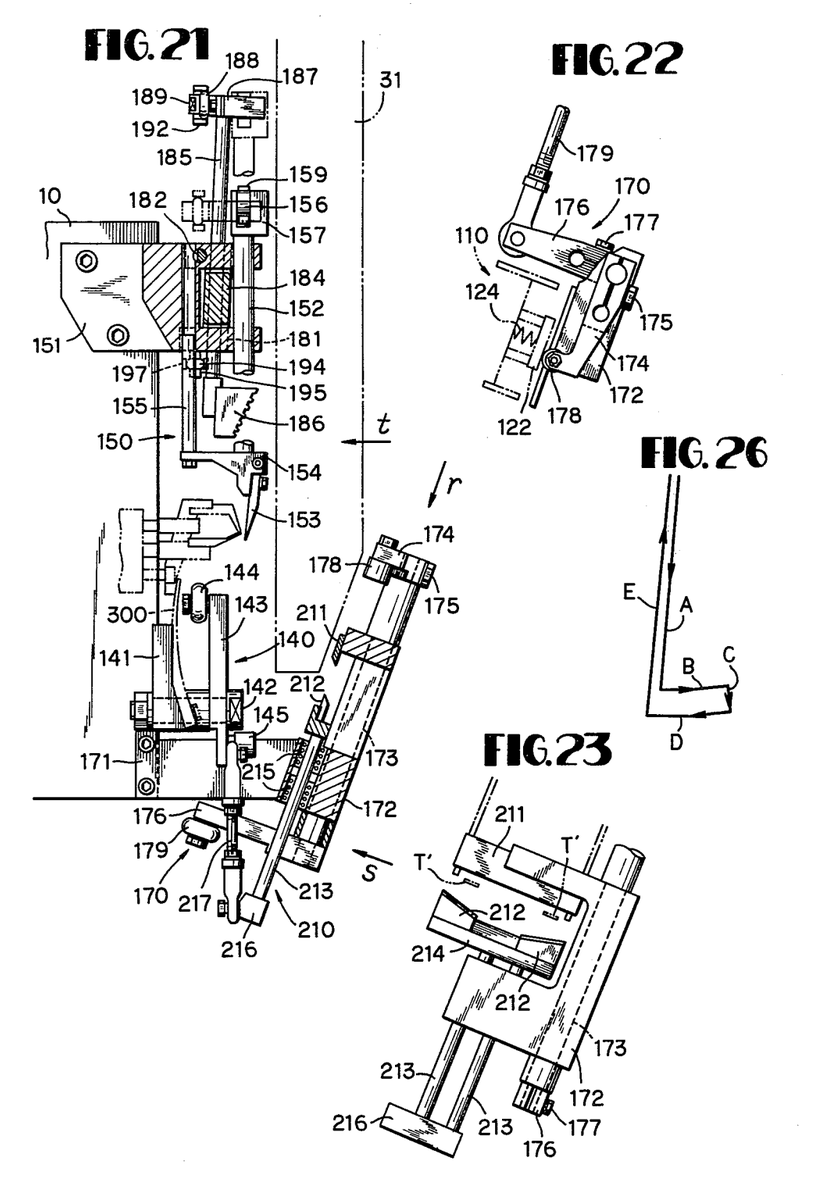
FIG. 21 is an enlargement of the q portion of FIG. 2.
FIG. 22 is a projection of a part of FIG. 21 seen from the r point.
FIG. 23 is a projection of a part of FIG. 21 seen from the s point.
FIG. 26 is a diagram for showing the locus of the movement of the feeding comb in FIG. 21.
Figures 24, 25:
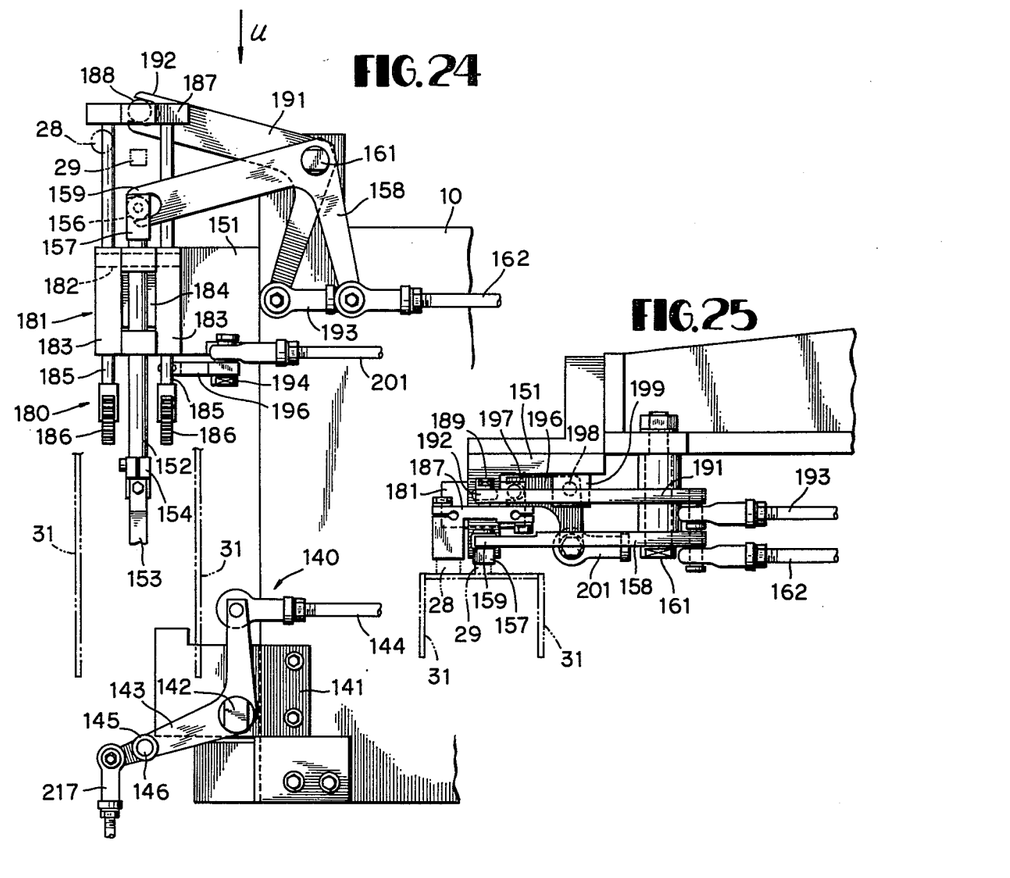
FIG. 24 is a projection of a part of FIG. 21 seen from the t point.
FIG. 25 is a projection of FIG. 24 seen from the u point.

Among the mechanisms in service for radial type components, (1) a transmitting mechanism 140 for transmitting the driving force of a driving mechanism to the tape-drawing-out mechanism 50, the lead-wire-positioning mechanism 70, and the waste-tape-cutting mechanism 80, and (2) the lead wire cutting mechanism 150 are positioned on the mounting machine side. The transmitting mechanism 140 is most clearly illustrated in FIG. 24, wherein a lever 143 is with a pin 142 pivoted on a sustaining member 141 secured to the main body 10 of the mounting machine 1. The lever 143 of bell-crank form is connected, at one end thereof, to a driving mechanism including a motor, cam, etc. (not shown as it may be an ordinary one), and rotated around a pin 142 at a predetermined timing, being interlocked with the rotation of the turret table of the mounting mechanism 8. On the other end of this lever 143 is pivoted a roller 145 with a pin 146. When the lever 143 is clockwise rotated, the roller 145 will raise, resisting the spring force of the compression spring 65, the lifting member 56, shown in FIG. 8, for actuating the mechanisms 50, 70, and 80 to simultaneously operate. The lead wire cutting mechanism 150 is, as shown most clearly in FIG. 21, provided with a rod 152 slidably retained by a retaining member 151, which is secured to the main body 10 of the mounting machine 1. A cutting blade 153 is secured to a mounting bracket 154, which is fixed to the lower end of the rod 152. The mounting bracket 154 has another rod 155 stood thereon, slidably pierced through the retaining member 151, which prevents the cutting blade 153 from rotating about the axial line of the rod 152. On the upper end of the rod 152 is secured a roller retaining member 157 for retaining a roller 156, which being engaged with the yoke portion 159 of a lever 158. The lever 158 of bell-crank form is, as shown in FIG. 24, pivoted at the middle portion thereof, with a pin 161, to the main body 10 of the mounting machine 1, and at the other end thereof is, with a connecting rod 162, connected to a driving mechanism of ordinary structure (not shown). When the lever 158 is anti-clockwise rotated, in FIG. 24, in conjunction with the rotation of the mounting mechanism 8, the cutting blade 153 is lowered to cut lead wires L of a radial type component in cooperation with the guide block 67 shown in FIGS. 8 and 12.

Various mechanisms for handling axial type components must be illustrated next: a transmitting mechanism 170 for transmitting the driving force to the form-rectifying-and-positioning mechanism 110 disposed on the cartridge 27 for axial type components; a tape feeding mechanism 180 for feeding a component-loaded tape to the form-rectifying-and-positioning mechanism 110; and a waste-tape-cutting mechanism 210 for cutting a portion of the tape after having been stripped of components.

The transmitting mechanism 170 is, as shown in FIG. 21, supported by a supporting member 171 secured to the main body 10 of the mounting machine 1. The supporting member 171 is provided, at the end portion thereof, with a sideways U-letter shaped frame 172, as shown in FIG. 23, which is pierced by, at the bottom portion thereof, a rotating shaft 173. On the upper end of the rotating shaft 173 is secured a lever 174 with a bolt 175 (see FIG. 22), and on the lower end thereof is secured a lever 176 with a bolt 177. On the free end of the lever 174 is pivoted a roller 178, and on the free end of the lever 176 is connected a driving mechanism of ordinary structure (not shown) by a connecting rod 179. When the lever 176 is clockwise (in FIG. 22) rotated by a force coming from the not-shown driving mechanism in conjunction with the mounting mechanism 8, the lever 174 is also rotated clockwise for advancing the driven member 122 of the form-rectifying-and-positioning mechanism 110 overwhelming the spring force of the compression spring 124.

The tape feeding mechanism 180 is retained by the same retaining member 151 as for the lead wire cutting mechanism 150. A member 181 is pivoted with a pin 182 to the retaining member 151. The member 181 is of substantially H-form, as clearly illustrated in FIG. 24, a swing portion 183 on either side being connected by a centrally located connecting portion 184; each of the swing portions 183 is slidably pierced by a rod 185. The upper end of each rod 185 is connected together by a connecting member 187, and on each lower end of the rod 185 is secured a feeding comb 186. The connecting member 187 is provided with, as shown in FIG. 21, a pin 189 having a spherical surface 188, on which a yoke portion 192 of a lever 191 being embracingly engaged. The lever 191 of bell-crank form is, as shown in FIG. 24 pivoted at the middle portion thereof to the main body 10 of the mounting machine 1 with the same pin 161 as for the lever 158, one end thereof being connected with a connecting rod 193 to a driving mechanism of ordinary structure (not shown). On the lower surface of the oscillating member 181 as clearly indicated in FIG. 21, is disposed a pin 195 including a spherical surface 194, on which the yoke portion 197 of a lever 196 is engaged. The lever 196, clearly indicated in FIG. 25, of bell-crank form is pivoted, at the middle portion thereof, with a pin 198 to the lug 199 of the retaining member 151, one end thereof being connected with a connecting rod 201 to a driving mechanism of ordinary structure (not shown). The connecting rod 201 and the connecting rod 198 are shifted, being interlocked with the rotation of the mounting mechanism 8, at a predetermined timing. the feeding comb 186 is consequently shifted, describing a locus A, B, C, D, and E in FIG. 26, to impart feeding movement to the tape loaded with components. In other words, the feeding comb 186 is engaged with a plurality pairs of the lead wires L (of components) held on the tape guide 95 in a manner shown in FIG. 17, at the process B of FIG. 26; in the process C the component loaded tape is lowered by one pitch; and one cycle of feeding of components is finished by the separation of the feeding comb 186 from the lead wires L in the D process. The processes A and E are made for retracting the feeding comb 186 to the non-operative position shown in FIGS. 24 and 28.

Lastly, the waste-tape-cutting mechanism 210 is, as shown in FIG. 21, being mounted on, by the same retaining member as for the above-mentioned transmitting mechanism 170, the main body 10 of the mounting machine 1. On the upper jaw of the sideways U-letter shaped frame 172 is secured a fixed blade 211, and on the lower jaw of the same frame are retained a pair of movable blades 212 for cutting, in cooperation with the fixed blade 211, the waste tape T'. Particularly speaking, the movable blades 212 are retained by a mounting member 214 supported on the tip of a pair of rods 213, being pierced through slide ball bearings 215 which are secured to the lower jaw of the frame 172. The pair of rods 213 are connected together by a connecting member 216, which being connected to, via a connecting rod 217, one end of the lever 143 of the transmitting mechanism 140. In other words, the transmitting mechanism 140 functions as a mechanism for transmitting the driving force to the waste-tape-cutting mechanism for axial type components, in addition to its original function for transmitting the driving force to various mechanisms built-in the cartridge 26 for radial type components. When the lever 143 is clockwise (in FIG. 24) rotated the movable blades 212 are raised toward the fixed blade 211 for cutting one pitch of the waste tape T' into a small piece.

OPERATION

Component inserting method, in case wherein radial type and axial type components are mixed, onto a p-c-b will be described.

Firstly, reels 38 or boxes 39 for containing tapes of two kinds of components, axial type and radial type, are attached to the basket body 36 of the cartridge 26 and the cartridge 27 according to the species of the tape. At this time a cartridge 26 having a guide blade 67 (see FIGS. 12 and 28), on which positioning grooves 68 corresponding to the pitch (gage) of the lead wires of the radial type components to be set are formed, should be selected. If a cartridge 26 of such desired condition can not be found, the guide blade 67 itself shall be changed to one desirable. And as for the cartridge 27, one must be selected which is well adjusted, at the distance between the guide arms 113 thereof, to adapt to the lead wire gage of the axial type components. Otherwise, the distance of the guide arms 113 shall be adjusted to the desired distance by loosening the thumbscrew 115.

The pulled-out-end of the tape loaded with radial type components from the reel 38 or the box 39 is led through, as shown in FIG. 5, the sprocket 44 and the roller 45 to be, passing along the guide roller 46 and the guide sprocket 47, wound on the feed sprocket 48. And the pulled-out-end of the tape loaded with axial type components from the reel 38 or the box 39 is, as shown in FIGS. 15 and 17, retained by the tape guide 95 after having passed through the guide rail 91.

The cartridges 26 and 27, being finished of component setting, are attached to the outer periphery of the rotation table 22 as shown in FIG. 5, generally in accordance with the order of planting to the p-c-b. The attaching operation of the cartridge (26 and 27) to the rotation table 22 is very simple, as it is composed of two simple actions, a first one is to hitch the fastening member 35 of the cartridge to the hook member 41 of the rotation table 22, and a second one is to engage the fastening member 34 of the cartridge to the holding spring 42, resisting the spring force, from underside, while slightly rotating the cartridge about the fastening member 35.

Assume to insert first radial type components to a p-c-b, the rotation table 22 is rotated under the commanding signal from the control panel 6 so far that the cartridge 26 comes to stop exactly confronted to the inserting mechanism 8. The engaging protrusion 28 on the cartridge 26 is halted at an engaging position, as shown in FIG. 24 and FIG. 25 with two-dot-chain lines, with a connecting member 187 to restrict the operation of the tape feeding mechanism 180 for axial type components. The driving mechanism (not shown) for actuating the tape feeding mechanism 180 is of such construction that a connecting rod 193 is constantly biased rightwardly (in FIG. 24) by a spring force and is shifted leftwardly by a cam, which is rotated in conjunction with the rotation of the inserting mechanism 8. Therefore, the driving mechanism for the connecting rod 193 can not be damaged, even when the tape feeding mechanism is forcibly stopped of operation by the engaging protrusion 28.

When the cartridge 26 is halted at a predetermined position, the lead-wire-positioning mechanism 70 is actuated by the driving mechanism. That is to say, the lever 143 is rotated in a clockwise direction, and in turn the roller 145 will push upwards, as shown in FIG. 8, the lifting member 56, followed by rising of the guide blade 67, which is to engage from below with the lead wire L retained by the tape-pulling-out mechanism 50.

The lead wires L are to be, due to the engagement with the guide blade 67, exactly positioned by the positioning grooves 67, as shown in FIG. 12; at this moment the chuck 7 illustrated in FIG. 3 is advanced in an opened status. When the same is closed at the farthest advanced position, it grasps the lead wires L, as shown in FIG. 4, precisely at the predetermined pair of V-grooves 15.

Next, the lead wire cutting mechanism 150 is actuated, i.e., the lever 158 is anti-clockwise rotated, as far as the position illustrated in FIG. 24, to lower the cutting blade 183, which is to shear the lead wires L with the aid of the guide blade 67 shown in FIGS. 12 and 28. At this time the lead wires L are affected by a force in the direction of pulling out the same from the chuck 7; as the chuck 7 is then, however, under a reinforced closing action by a leaf spring 300, indicated with a two-dot-chain line in FIG. 21, the lead wires L are prevented from being shifted within the chuck 7.

As soon as the shearing of the lead wires L is ended, a component W is separated from the tape T for being transmitted to the chuck 7. With the retraction of the chuck 7, holding the component W therein, a supplying operation of the component from the component supplying machine 20 to the mounting machine 1 is finished.

The cutting blade 153 is raised next and the guide blade 67 is lowered at the same time, causing a lowering of the tape by one pitch interlocked with the descending of the guide blade 67. As the roller 145 of the transmitting mechanism 140 descends in FIG. 8, the guide blade 67 and the lifting member 56 are descended by the restoring force of the compression spring 65; and the lifting member 56 is connected, via the connecting rod 55, to the tape-pulling-out mechanism 50. So the descending of the lifting member 56 automatically rotates the feeding sprocket 48 by a predetermined angle, accompanying the feeding of the tape T wound thereabout by one pitch. This movement results in shifting of a next component W to the position ready to the next supplying action, finishing a cycle of the radial type component supplying operation.

The waste tape T' stripped of a component W is fed by this feeding operation toward the waste-tape-cutting mechanism 80, being cut into a small piece by the length of one pitch at the next time but one of rising of the guide blade 67. In other words, the waste tape T' is pulled down into the chute 81, as shown in FIG. 13, by the next feeding operation, and when the guide blade 67 is raised next, it is to be cut (or sheared) between the cutting blade 86, which is mounted on the same mounting member 66 as for the guide blade 67 for being raised together therewith, and the side wall 87 of the chute 81.

Assume that axial type components are inserted to the p-c-b next, then the rotation table 22 is rotated by one cartridge-circumferential angle (10 degrees in this embodiment). Following the cartridge 26, for radial type components which has just finished the component supplying operation, a cartridge 27 for axial type components, disposed just next to the former, is shifted as far as it is rightly confronted to the inserting mechanism 8. The engaging protrusion 29 securely disposed on the cartridge 27 is halted at a position indicated by a two-dot-chain line in FIGS. 24 and 25, for being engaged with the roller retaining member 157 of the lead wire cutting mechanism 150 located at the lifted position, to block the operation thereof. Just like in the case of the tape feeding mechanism 180, the driving mechanism for driving the lead wire cutting mechanism 150 can not be damaged.

The form-rectifying-and-positioning mechanism 110 shown in FIG. 16 through FIG. 20 and FIG. 28, comes into operation successively, actuated by the driving mechanism. The roller 178 of the transmitting mechanism 170 causes the driven member 122, overwhelming the spring force of the compression spring 124, to be shifted. This shifting is accompanied by advancing of the supply guide 126 and the lead wire cutter 127, in order to cut the lead wires L with the aid of the projection 134 on the guide arms 113, to bend the same at right angle for rectifying the form of the two lead wires L in a parallelly extending status to each other, and to make the component W project from the tip of the guide arms 113 a predetermined distance. The distance between the pair of lead wires L is, at this status, to be exactly agreed with one of the standardized pitches by means of the adjustment of the distance between the pair of guide arms 113. Besides, the guide arms 113 are exactly confronted to the mounting mechanism 8, by the servomotor 23, shown in FIG. 2, with the result of an exact positioning of the lead wires L against the V-grooves 15 of the chuck 7. If the chuck 7, after the supply guide 126, which had pushed out the component W a predetermined distance from the tip of the guide arms 113, has been retracted, receives the component W for being drawn back with it, the end portion of the lead wires L which have been held by the guide arms 113, will be released therefrom. An axial type component has been herewith completely transferred from the component supplying machine 20 to the mounting machine 1.

Following the retraction of the supply guide 126, the tape feeding mechanism 180 is actuated to feed the tape loaded with components by one pitch toward the form-rectifying-and-positioning mechanism 110. That is, the lever 191 and the lever 136 in FIG. 24 are rotated by the driving mechanism (not shown) at a predetermined timing to make the feeding comb 186 move, while describing the locus indicated in FIG. 26. In the meantime the tape loaded with components is fed, before the feeding comb returns to the ascending position.

The waste tape T' stripped of components is guided to the waste-tape-cutting mechanism 210, by the waste tape guide 137 attached to the lower end of the cartridge 27, to be cut into pieces by every pitch. Thereafter the pieces of the cut waste tape are exhausted, via the chute 90, to the rear of the main body 10 of the mounting machine 1.

The above description is concerned to a case wherein a radial type component and an axial type component are supplied, one after another, to the mounting machine 1. Practically, a lot of such components are repeatedly supplied in a predetermined order to the mounting machine 1 to be inserted to a p-c-b. It is preferable in this instance that the rotation table 22 is rotated in a preset direction by a certain angle (10 degrees in this embodiment) corresponding to the arrangement pitch of the cartridges 26, 27 for supplying the components in the arranged order of the cartridges 26, 27. However, it is also possible to inversely rotate the rotation table 22 temporarily or to skippingly rotate by a few pitches at a time, in such an exceptional case wherein the number of components to be planted in one p-c-b exceeds 36 (the sum of cartridges 26, 27 attachable to one rotation table) and a plurality of components of same species are included in those 36 components.

As can be understood from the above description this embodiment is characterized in the capability of arranging two kinds of cartridges 26, 27, for radial type components and axial type components, 36 in all, and moreover of handling the lead wires L of varied gage (pitch). It means that this embodiment can supply radial and axial type components of various gages, 36 species at the maximum, to the mounting machine 1 in a desired order.

Another important feature of this embodiment is that several mechanisms built in the cartridges 26, 27 are actuated, only when the cartridge comes to a stop in confrontation with the mounting machine 1, by a corresponding driving mechanism disposed on the mounting machine side, and that all of the built-in mechanisms can perform a cycle of the respective operation actuated by a simple pushing action from the lifting member 56, driven member 122, etc.

Still another important feature of this embodiment is that some mechanisms, which are desired to be operative when a specific type component is supplied and not operative while other type component is supplied, such as the lead wire cutting mechanism 150 for radial type components, tape feeding mechanism 180 for axial type component, etc., are so constructed as to be mechanically restricted of its operation by the engaging protrusions 28, 29 disposed on the respective cartridge. It greatly serves to reduce the manufacturing cost in comparison to a construction wherein electric control from the control panel is employed.

As this embodiment is capable of planting components of different type, radial and axial, in a desired order, it is adaptable to any change of component arrangement on a p-c-b due to a design change, by only changing the arrangement order of the cartridges 26, 27, or changing the components on a cartridge. Moreover, the structure of the entire system for attaining the desired purposes can be made compact and inexpensive.

The present invention is by no means limited to the exemplified embodiment. Various modifications and variations can be made to those skilled in the art without departing from the spirit and scope of the invention.

For demonstrating the possibility of modifications, an example thereof is disclosed hereunder.

Figure 27:
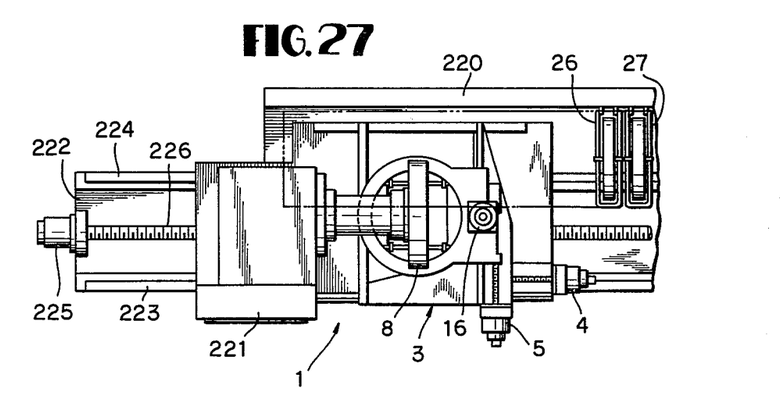
FIG. 27 is a schematical plan view of another embodiment of this invention.

Cartridges 26, 27 may be arranged, not to a rotation table, but to a fixed linear table 220, as in FIG. 27. In this instance, the main body 221 of the mounting machine 1 is movably mounted on guide rails 223, 224 disposed on the machine base 222, for being shifted by a servomotor 225 and a feeding screw 226, by which the mounting mechanism 8 may be positioned in exact confrontation with the desired cartridge. In short, a component supplying machine and a mounting machine should be relatively movable such that an arbitrary cartridge may be halted in confrontation with the mounting machine. Besides, the mounting machine itself is not limited to the above described embodiment, either. Any of the machine which is capable of mounting two types of components, radial and axial, to a p-c-b is good for the purpose.

What is claimed is:

1. An electronic-component mounting system composed of an electronic-component-mounting machine for mounting electronic components to a printed circuit board and an electronic-component supplying machine for supplying electronic components to said electronic-component mounting machine, said electronic-component supplying machine comprising:

at least one cartridge for containing radial type electronic components, having respectively therein a container containing a tape, to which each of a pair of lead wires extending in a same parallel direction from a head of said radial type electronic components is stuck at the tip portions thereof; a tape-drawing-out mechanism for pulling out a tape loaded with said components from a basket body; and a lead wire positioning mechanism for positioning one after another said pair of lead wires stuck on said tape in relation to said electronic component mounting machine;

a cutting mechanism associated with such a cartridge containing radial type electronic components for shearing the positioned lead wires of said radial type electronic components;

at least one cartridge for containing axial type electronic components having respectively therein a container containing a pair of tapes, to which each pair of lead wires extending in a same axial but opposite direction from a head of said axial type electronic components are respectively stuck at each tip portion thereof, to be pulled out with one end ahead, and a form-rectifying and positioning mechanism associated with such a cartridge containing axial type electronic components for shearing one after another said pair of lead wires stuck on said tapes, rectifying form of said lead wires by bending the same at right angle into a mutually parallelly extending status with a predetermined distance from each other, and positioning the form-rectified lead wires in relation to said electronic component-mounting machine; and a table to which said two types of cartridges are attached, in a desired order and in an easily detachable manner, said table and said mounting machine being relatively movable to each other for making desired one of said cartridge confront said mounting machine; and wherein said electronic-component mounting machine is provided with at least one chuck for commonly receiving both of the radial type electronic components and the axial type electronic components directly from the two types of cartridges irrespective of mixture of types, holding said components at their lead wires, and transferring the held components to right above lead-wire-inserting holes of said printed circuit board into which said held lead wires are to be inserted.

2. An electronic-component mounting system in accordance with claim 1, wherein said cutting mechanism also serves as said lead wire positioning mechanism and one part of said cutting mechanism is disposed on said cartridge for containing radial type electronic components and another part of said cutting mechanism is disposed on said mounting machine.

3. An electronic-component mounting system in accordance with claim 2, wherein said cartridge for containing radial type electronic components and said cartridge for containing axial type electronic components contain electronic components of different nominal lead wire pitch, to each other, and said electronic components, different in type as well as in nominal lead wire pitch, can be inserted mixedly and in a desired order.

4. An electronic-component mounting system in accordance with claim 1, wherein said lead wire positioning mechanism includes a blade having a pair of positioning grooves parallelly formed to each other, which pair is of distance identical to a nominal lead wire pitch of said radial type electronic components, and guiding portions for guiding the pair of lead wires to be held to said positioning grooves when said guide blade is moved in a direction which is normal to said pair of lead wires.

5. An electronic component mounting system in accordance with claim 1, wherein said two types of cartridges are arranged in parallel with respect to one another and are attached in a linear arrangement, and said table and said mounting machine are relatively and linearly shiftable with respect to one another for making desired one of said cartridges confront said mounting machine.

6. An electronic-component mounting system in accordance with claim 1, wherein said table is rotated about a rotating axis said axis being located substantially perpendicular to said rotation table thereof by a desired circumferential angle for making a desired one of said cartridges, which are attached about said rotating axis with an equal circumferential distance from each other, confront said mounting machine, and driving means for rotating said table about said rotating axis for making desired ones of said cartridges individually confront said mounting machine.

7. An electronic-component mounting system in accordance with claim 1, wherein said at least one chuck comprises a pair of pawls capable of opening and closing in a direction which is normal to a plane in which the pair of lead wires to be chucked are to be and capable of chucking said pair of lead wires with chucking surfaces formed face to face on each tip portion of said pair of pawls, while loosely accomodating the head of the component between said pawls.

8. An electronic-component mounting system in accordance with claim 7, wherein one of said pair of pawls is a fixed pawl having V-shaped grooves formed on said chucking surface with a plurality of distances corresponding to different nominal lead wire pitches and the other of said pair of pawls is a movable pawl for holding the pair of lead wires in said V-shaped grooves.

9. An electronic-component mounting system in accordance with claim 1, wherein at least either one of the two kinds of cartridges for respectively containing one of the two types of components, radial and axial, exists in plurality, and said one of the two kinds of cartridges respectively contains components of different nominal lead wire pitch per each cartridge, whereby insertion of components, irrespective of mixture of types and nominal lead wire pitches, are performed in a desired order.

10. An electronic-component mounting system in accordance with claim 1, wherein said form-rectifying-and-positioning mechanism comprises:
a pair of guide arms disposed parallelly to each other, each of said guide arms having a projection on an upper surface of a tip portion thereof;
a pair of supply guides disposed slidably on a pair of inner side surfaces of said pair of guide arms, each of said supply guides having a V-shaped notch on the tip thereof for receiving and pushing forward the lead wire when said supply guides are advanced along said guide arms; and
a pair of lead wire cutters disposed slidably on a pair of outer side surfaces of said pair of guide arms, said cutters being advanced together with said supply guides for cutting the lead wires in cooperation with said projections of said guide arms prior to rectifying of the lead wires by said supply guides in cooperation with said projections.

11. An electronic-component mounting system in accordance with claim 10, wherein said pair of guide arms are secured to a base block with loosenable fastening means, and on either contacting surface of said guide arms and said base block serrations are formed parallelly to said guide arms, which enable the distance between said pair of guide arms to be progressively adjusted by every pitch of said serrations.

* * * * *